United States Patent
Kim et al.

(10) Patent No.: US 9,933,644 B2
(45) Date of Patent: Apr. 3, 2018

(54) DISPLAY MODULE AND MULTI-DISPLAY DEVICE HAVING THE SAME

(71) Applicant: Samsung Display Co., Ltd., Yongin (KR)

(72) Inventors: Jong Seong Kim, Seoul (KR); Sang Il Kim, Yongin-si (KR); Tae Hwan Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 251 days.

(21) Appl. No.: 14/547,693

(22) Filed: Nov. 19, 2014

(65) Prior Publication Data

US 2015/0370113 A1 Dec. 24, 2015

(30) Foreign Application Priority Data

Jun. 19, 2014 (KR) .......................... 10-2014-0075041

(51) Int. Cl.
*G02F 1/1345* (2006.01)
*G02F 1/1333* (2006.01)
*H05K 1/18* (2006.01)

(52) U.S. Cl.
CPC ......... *G02F 1/13336* (2013.01); *H05K 1/189* (2013.01); *H05K 2201/10128* (2013.01)

(58) Field of Classification Search
CPC ....... G02F 1/13336; G06F 1/16; H05K 1/028; H05K 2201/10128; H05K 1/113; H01B 13/10; H01B 7/0258; H02G 5/06; H02G 5/005

See application file for complete search history.

(56) References Cited

U.S. PATENT DOCUMENTS

| | | | |
|---|---|---|---|
| 5,510,915 A * | 4/1996 | Ge | G02F 1/1362 349/149 |
| 7,570,483 B2 | 8/2009 | Kim | |
| 8,213,167 B2 | 7/2012 | Kim | |
| 2007/0070027 A1* | 3/2007 | Kim | G02F 1/1345 345/103 |
| 2008/0137166 A1* | 6/2008 | Sah | G02F 1/13452 359/245 |
| 2009/0316344 A1 | 12/2009 | Kim | |
| 2011/0260949 A1* | 10/2011 | Ahn | H01J 11/12 345/1.3 |

(Continued)

FOREIGN PATENT DOCUMENTS

| | | |
|---|---|---|
| KR | 10-2011-0138007 | 12/2011 |
| KR | 10-2012-0054684 | 5/2012 |
| KR | 10-2014-0003995 | 1/2014 |

OTHER PUBLICATIONS

Seiko Epson, JP 2011-22528 English translation.*

*Primary Examiner* — Steven T Sawyer
(74) *Attorney, Agent, or Firm* — H.C. Park & Associates, PLC

(57) ABSTRACT

A display module for a multi-display device includes an array substrate, connectors disposed on the array substrate and configured to transmit signals for driving the array substrate, a printed circuit board (PCB) electrically connected to the connectors and configured to transmit signals to the connectors, and connecting members that extend through the array substrate and configured to electrically connect the connectors and the PCB.

4 Claims, 14 Drawing Sheets

(56) References Cited

U.S. PATENT DOCUMENTS

| | | | |
|---|---|---|---|
| 2013/0201640 A1* | 8/2013 | Kim | H05K 1/189 |
| | | | 361/749 |
| 2013/0314883 A1* | 11/2013 | Ling | H05K 7/026 |
| | | | 361/749 |
| 2014/0049522 A1* | 2/2014 | Mathew | H05B 33/0896 |
| | | | 345/204 |
| 2014/0071657 A1* | 3/2014 | Sekiguchi | G02F 1/1333 |
| | | | 362/97.1 |
| 2014/0184057 A1* | 7/2014 | Kim | G06F 1/1637 |
| | | | 313/504 |

* cited by examiner

DISPLAY MODULE AND MULTI-DISPLAY DEVICE HAVING THE SAME

CROSS-REFERENCE TO RELATED APPLICATION

This application claims priority from and the benefit of Korean Patent Application No. 10-2014-0075041, filed on Jun. 19, 2014, which is hereby incorporated by reference for all purposes as if fully set forth herein.

BACKGROUND

Field

Exemplary embodiments relate to a display module and a multi-display device having the same.

Discussion of the Background

In accordance with the progress and maturation of the modern information society, manufacturers have increasingly become faced with market demands for larger and thinner display devices that related-art cathode ray tube (CRT) devices cannot meet, and as a result, the demand for flat-panel display devices, such as a plasma display panel (PDP) device, a plasma address liquid crystal display panel (PALC) device, a liquid crystal display (LCD) device, and an organic light-emitting diode (OLED) display device, has grown.

An LCD device, for example, includes glass substrates and a liquid crystal layer disposed between the glass substrates. In response to the LCD device being powered by power sources provided at the top and the bottom of the glass substrates, the LCD device transforms the power into light. As a result, the LCD device displays an image.

In recent years, large-screen display devices have become more and more popular, directing public attention toward multi-display devices, which are display devices equipped with plural display modules.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display module having a decreased size of a non-display region.

Additional aspects will be set forth in the detailed description which follows, and, in part, will be apparent from the disclosure, or may be learned by practice of the inventive concept.

Exemplary embodiments of the invention provide a multi-display device having a decreased distance between display modules, and having an improved visibility because of a decreased dead space between the display modules.

However, exemplary embodiments of the invention are not restricted to those set forth herein. The above and other exemplary embodiments of the invention will become more apparent to one of ordinary skill in the art to which the invention pertains by referencing the detailed description of the illustrated embodiments given below.

According to exemplary embodiments of the invention, a display module includes an array substrate, connectors disposed on the array substrate and configured to transmit signals for driving the array substrate, a printed circuit board (PCB) electrically connected to the connectors and configured to transmit signals to the connectors, and connecting members disposed to extend through the array substrate and configured to electrically connect the connectors and the PCB.

According to exemplary embodiments of the present invention, a multi-display device includes display modules arranged in a pattern; and a housing configured to fix the display modules, wherein each of the display modules includes an array substrate, connectors disposed on the array substrate and configured to transmit signals for driving the array substrate, a printed circuit board (PCB) electrically connected to the connectors and configured to transmit signals to the connectors, and connecting members disposed to extend through the array substrate and configured to electrically connect the connectors and the PCB.

According to exemplary embodiments of the present invention, a multi-display device includes a first array substrate, a second array substrate disposed adjacent to the first array substrate, first connectors disposed on the first array substrate and configured to transmit signals for driving the first array substrate, second connectors disposed on the second array substrate and configured to transmit signals for driving the second array substrate, a printed circuit board (PCB) configured to electrically connect and transmit signals to the first connectors and the second connectors, first connecting members disposed to extend through the first array substrate and configured to electrically connect the first connectors and the PCB, and second connecting members disposed to extend through the second array substrate and configured to electrically connect the second connectors and the PCB.

According to the exemplary embodiments, it is possible to provide a display module having a decreased area of a non-display region.

According to the exemplary embodiments, it is possible to provide a multi-display device having a decreased distance between display modules, and having an improved visibility by having a decreased dead space between the display modules.

Other features and exemplary embodiments will be apparent from the following detailed description, the drawings, and the claims.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
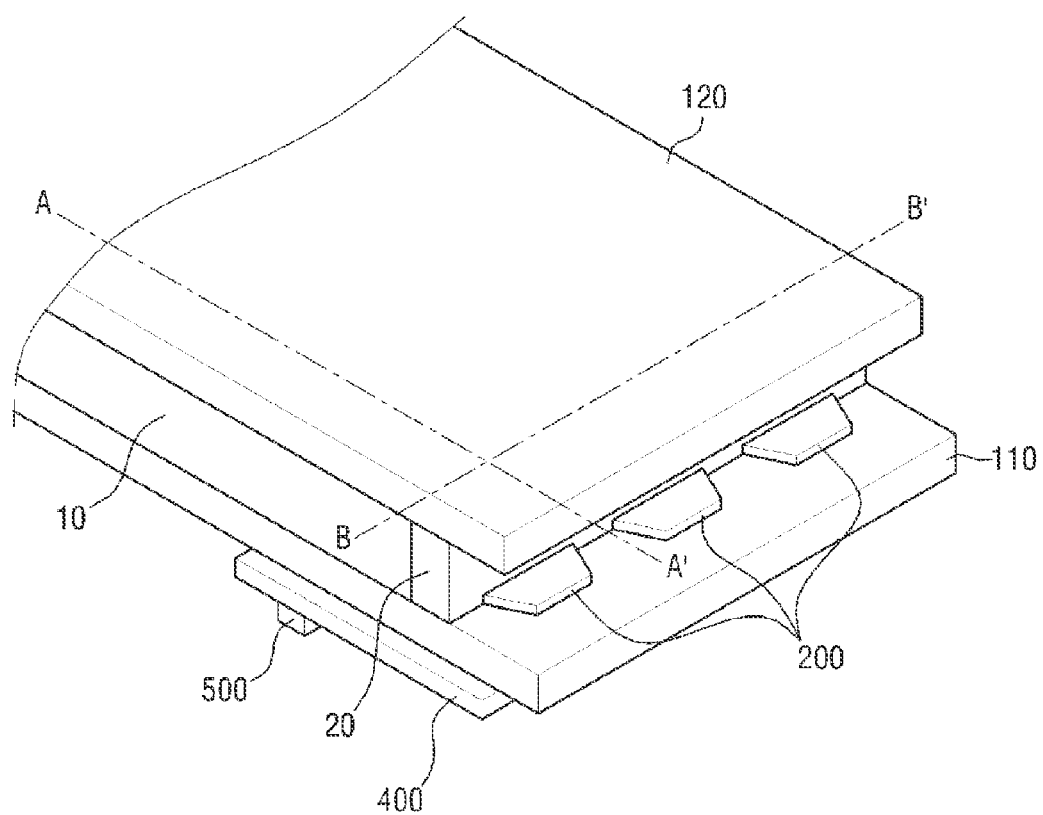
FIG. 1 is a perspective view of a display module according to exemplary embodiments of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein. Exemplary embodiments will hereinafter be described with reference to the accompanying drawings.

Figure 2:
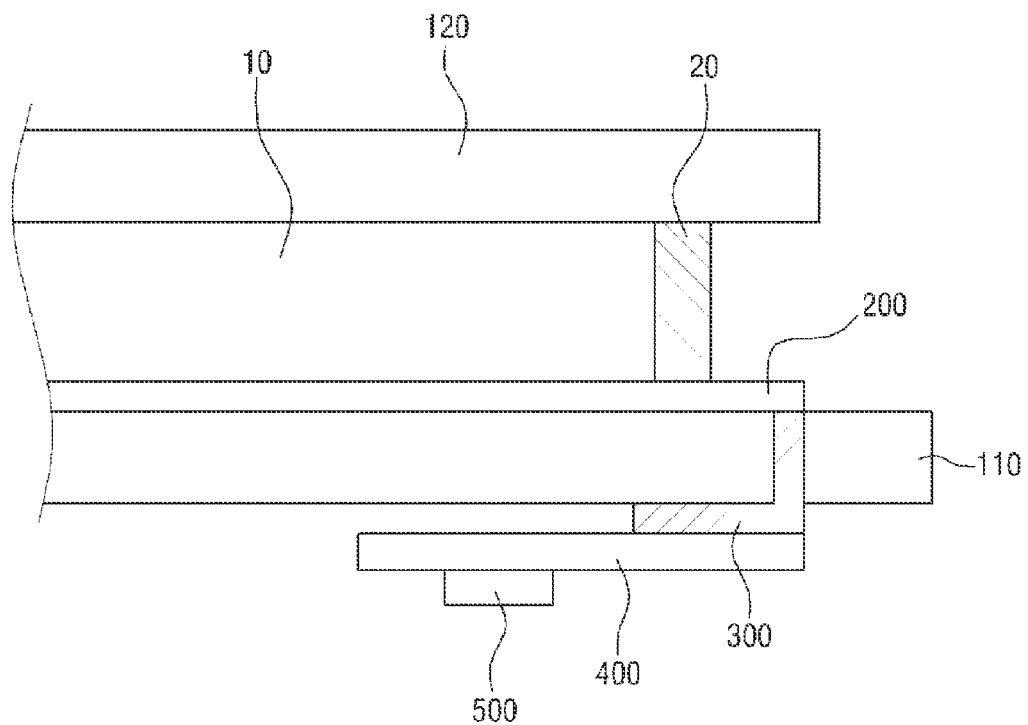
FIG. 2 is a cross-sectional view taken along line A-A' of FIG. 1.
Figure 3:
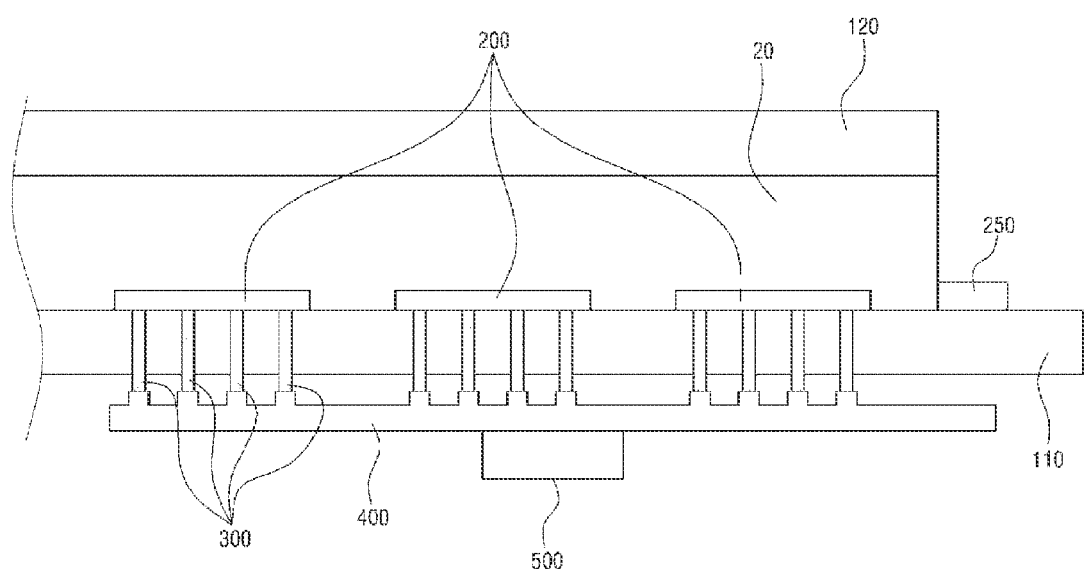
FIG. 3 is a cross-sectional view taken along line B-B' of FIG. 1.
Figure 4:
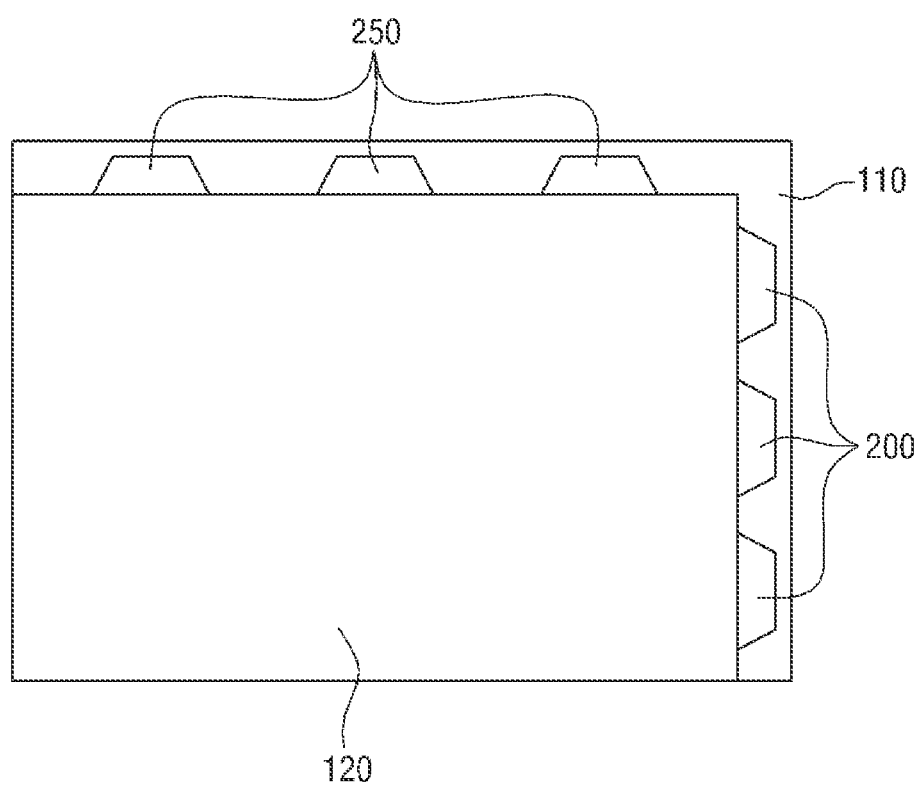
FIG. 4 is a plan view of the display device illustrated in FIG. 1.

FIG. 1 is a perspective view of a display module according to exemplary embodiments of the invention, FIG. 2 is a cross-sectional view taken along line A-A' of FIG. 1, FIG. 3 is a cross-sectional view taken along line B-B' of FIG. 1, and FIG. 4 is a plan view of the display device illustrated in FIG. 1.

Referring to FIGS. 1 to 4, a display module may include a first substrate 110, connectors 200, which are disposed on the first substrate 110 and transmit signals for driving the first substrate 110, a printed circuit board (PCB) 400, which is electrically connected to the connectors 200 and transmits signals to the connectors 200, and connecting members 300, which are provided to extend through the first substrate 110 and electrically connect the connectors 200 and the PCB 400.

More specifically, the display module may include the first substrate 110 and a second substrate 120, and may also include a liquid crystal layer 10 filled or disposed between the first substrate 110 and the second substrate 120. The liquid crystal layer 10 may be sealed by a sealing member 20, which is between the first substrate 110 and the second substrate 120 and along the edges of the first substrate 110 and the second substrate 120. The first substrate 110 may be an array substrate and include a thin-film transistor (TFT) layer, gate wiring, data wiring, a TFT array, and pixel electrodes, and a common electrode may be disposed on the second substrate 120. The first substrate 110 may be referred to herein as the array substrate 110.

The array substrate 110 may be divided into a display region and a non-display region surrounding the display region. The connectors 200 and connectors 250 may be disposed in the non-display region. The connectors 200 and the connectors 250 may include pads that extend from the data wiring or the gate wiring in the display region or terminals of the data wiring or the gate wiring. The connectors 200 and the connectors 250 are illustrated in FIGS. 1 to 4 as being disposed on pairs of adjoining sides, respectively, of the array substrate 110 that are perpendicular to each other, but aspects are not limited thereto. The connectors 200 and the connectors 250 may be data connectors and gate connectors, respectively, but aspects are not limited thereto. For convenience, only the connectors 200 will hereinafter be described in detail, and a description of the connectors 200 may be directly applicable to the connectors 250.

The array substrate 110 may be formed of a rigid material, such as glass or a plastic material, such as a polycarbonate (PC) resin. Further, the array substrate 110 may be formed of a flexible material, such as a polyimide (PI) resin. However, the material of the array substrate 110 is not limited thereto such that the array substrate 110 may be formed of other suitable materials.

The connectors 250 may be provided in the non-display region. The gate wiring may extend from the connectors 250 into the display region. The data wiring and the gate wiring may intersect each other, thereby defining pixels.

The PCB 400 may be provided on a bottom surface of the array substrate 110. That is, the PCB 400 and the second substrate 120 may be provided on opposite surfaces of the array substrate 110. For example, the second substrate 120 may be disposed on the top surface of the array substrate 110, and the PCB 400 may be disposed on the bottom surface of the array substrate 110.

Since the PCB 400 is provided on the bottom surface of the array substrate 110, the area of the non-display region of the array substrate 110 may be decreased. As a result, the width of the bezel of a display device may be decreased.

The display module may also include a driver integrated circuit (IC) chip 500 mounted on the PCB 400. The driver IC chip 500 may be mounted on the PCB 400 and may apply driving signals to the array substrate 110. The driving signals applied by the driver IC chip 500 may be transmitted to the array substrate 110 via the connectors 200, which are electrically connected to the PCB 400, resulting in an image being displayed by the display module.

The PCB 400 may include a conductive layer (not illustrated) to transmit electric signals. Accordingly, the PCB 400 may transmit the driving signals applied by the driver IC chip 500 to the connectors 200.

The PCB 400 may be a flexible PCB (FPCB), but aspects are not limited thereto. That is, the PCB 400 may be implemented as a rigid PCB or an FPCB.

The PCB 400 and the connectors 200 may be electrically connected to each other by the connecting members 300. The connecting members 300 may be formed of a conductive material to provide the electrical connection. The connecting members 300 may be electrically connected to the connectors 200, which include wiring from the display region or pads extended from such wiring.

As the connectors 200 are connected to wiring from the display region, the connectors 200 may include pads (not illustrated), which extend through the array substrate 110 and are connected to the connectors 200 below the array substrate 110. Accordingly, the pads of the connectors 200 may be electrically connected to the PCB 400 below the array substrate 110.

The driver IC chip 500 may be provided on an opposite surface of the PCB 400 opposite to a surface of the PCB 400 that faces the array substrate 110.

The array substrate 110 may include the display region and the non-display region surrounding the display region, and the connectors 200 may be provided in the non-display region. The connectors 200 may be electrically connected to the PCB 400 via the connecting members 300. The array substrate 110 may include through holes. The through holes may be formed in the non-display region of the array substrate 110. The connecting members 300 may be formed or disposed in the through holes. Accordingly, the connectors 200, the PCB 400 and the driver IC chip 500 may be electrically connected to one another in the display region of the array substrate 110. Therefore, the electrical connections need not be provided in the non-display region of the array substrate 110 such that an area of the non-display region may be decreased.

The through holes may be formed in the non-display region of the array substrate 100 by using a laser device. The connecting members 300 may be formed by injecting a metallic ink into the through holes or depositing a metal onto the through holes.

The through holes may be formed to have a diameter of about 10 μm to about 30 μm and a pitch of about 40 μm to about 50 μm. The PCB 400 may include a fine conductive pattern and fine wiring may be properly connected to each other via the through holes.

The connecting members 300, which extend through the array substrate 110 through the through holes, may be bent to be parallel to the bottom surface of the array substrate 110. That is, the connecting members 300 may extend through the array substrate 110 through the through holes, extending from the top surface of the array substrate 110 to the bottom surface of the array substrate 110, and be bent at the bottom of the array substrate 110 to extend toward the center of the array substrate 110 parallel to the bottom surface of the array substrate 110.

That is, the connecting members 300 may be bent at the bottom of the array substrate 110 to extend toward the display region of the array substrate 110, and as a result, the PCB 400 and the connecting members 300 may be connected inside the area of the rear surface of the array substrate 110. Accordingly, a connection structure for applying signals to the display region of the array substrate 110 may all be implemented within the area of the array substrate 110, thereby reducing the area required for the non-display region of the array substrate 110.

The entirety of the PCB 400 may be included within an area (total area of a surface) of the array substrate 110, and the PCB 400 may be provided on the rear surface of the array substrate 110. Accordingly, an electrical connection structure may be provided within the area of the array substrate 110, and, as a result, the area of the non-display region of the array substrate 110 may be decreased.

A backlight unit (not illustrated) may be provided below the display module. The backlight unit may include a light source unit (not illustrated), a light guide plate (not illustrated), a diffusion sheet (not illustrated), and a prism sheet (not illustrated).

The light source unit may use a point light source, such as a light-emitting diode (LED), or a line light source, such as an electroluminescent lamp (EL) or a cold cathode fluorescent lamp (CCFL), but aspects are not limited thereto.

The light guide plate may reflect, refract, and diffuse light incident upon a side thereof, thereby obtaining planar light. The light guide plate may guide the planar light to be emitted from the top thereof. The light guide plate may allow uniform surface light to be incident upon the display module.

The light guide plate may be formed of, for example, a polymethyl methacrylate (PMMA) resin, a polycarbonate (PC) resin, an acrylonitrile-styrene-butadiene copolymer resin, a polystyrene resin, an acrylonitrile-styrene copolymer resin, a polyolefin resin, or a polymethacrylstyrene (MS) resin, which is a combination of polymethacrylate and polystyrene, but aspects are not limited thereto.

The light guide plate may be wedge-shaped with a thickness gradually decreasing from one side thereof close to the light source unit to the other side thereof distant from the light source unit, or the light guide plate may be plate-shaped with a uniform thickness. However, the shape of the light guide plate is not limited thereto.

For an improved optical performance of the display module, one or more optical sheets, such as a diffusion film, a prism film, and a protective film, may be provided on the light guide plate. The diffusion film may diffuse light emitted from the light guide plate, and may provide the light to be supplied to the display module. The prism film may collect light diffused by the diffusion film in a direction perpendicular to the surface of the display module. Further, a micro-lens array film and a lenticular lens film may be included in the optical sheets. The structure and the arrangement of the optical sheets are not limited to those set forth herein, and may vary without departing from the scope of the invention.

A reflective sheet may be provided below the light guide plate. The reflective sheet may direct light emitted from the bottom of the light guide plate toward a display panel above the light guide plate. Due to the presence of the reflective sheet, light emitted from the bottom of the light guide plate may be reflected and may then travel toward the display module. A reflective pattern may be formed on the reflective sheet, and the density of the reflective pattern may gradually increase from one side of the reflective layer close to the light source unit to the other side of the reflective layer distant from the light source unit. The reflective pattern may allow light with uniform luminance to be supplied to the display module. Various optical sheets, other than those set forth herein, may also be provided to improve the luminance of the display module or preventing the occurrence of a moiré phenomenon without departing from the scope of the invention.

A display device, including the display module, may include a middle frame stacked above the optical sheets and a top chassis. The display module may be disposed on the middle frame, and the top chassis may be disposed to cover part of the display module from above the display module. The top chassis may have a window through which the display region of the array substrate 110 is exposed. A polarizing plate may be provided at each of the top and the bottom of the display module. Various elements of the display device other than those set forth herein may already be well known in the art and thus will not be described herein in detail.

Figure 5:
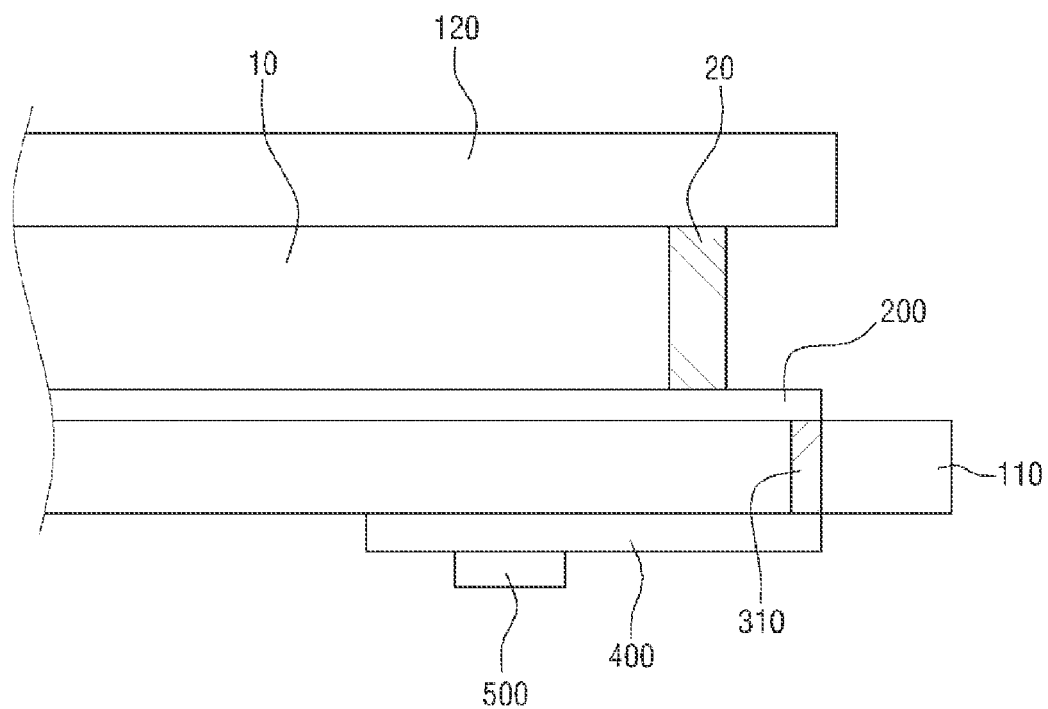
FIG. 5 is a cross-sectional view of a display module according to exemplary embodiments of the invention.

FIG. 5 is a cross-sectional view of a display module according to exemplary embodiments of the invention.

Referring to FIG. 5, a connecting member 310 may extend through an array substrate 110 from the top to the bottom of the array substrate through a through hole formed at the array substrate 110 and may be directly connected to a PCB 400 at the bottom of the array substrate 110. That is, wiring extended from a display region of the array substrate 110 may be directly connected to the connecting member 300 at the top of the array substrate 110, and the PCB 400 may be directly connected to the connecting member 300 at the bottom of the array substrate 110.

However, aspects of the invention are not limited thereto; for example, the connecting member 310 may be formed to extend through the array substrate 110 and then to protrude from the bottom surface of the array substrate 110, and a connecting pad may be provided at the protrusion of the connecting member 310. Here, the connecting pad may be electrically connected to the PCB 400.

More specifically, in a structure where the connecting pad and the PCB 400 connect to each other at the bottom of the array substrate 110, the connecting pad and the PCB 400 may be electrically connected by an anisotropic conductive film (ACF) including an insulating adhesive with conductive particles.

Figure 6:
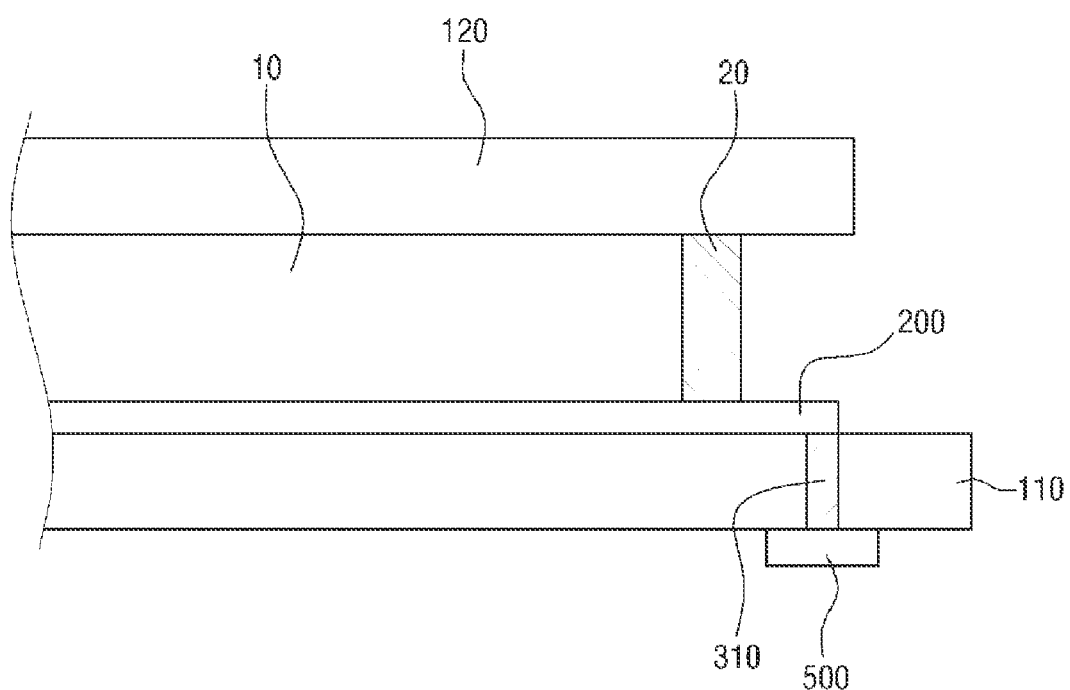
FIG. 6 is a cross-sectional view of a display module according to exemplary embodiments of the invention.

FIG. 6 is a cross-sectional view of a display module according to exemplary embodiments of the invention.

Referring to FIG. 6, a driver IC chip 500 may be directly connected to a connecting member 300 at the bottom of an array substrate 110. The driver IC chip 500 may be electrically connected to the connecting member 300 by solder, a conductive adhesive, or another conductive material.

Figure 7:
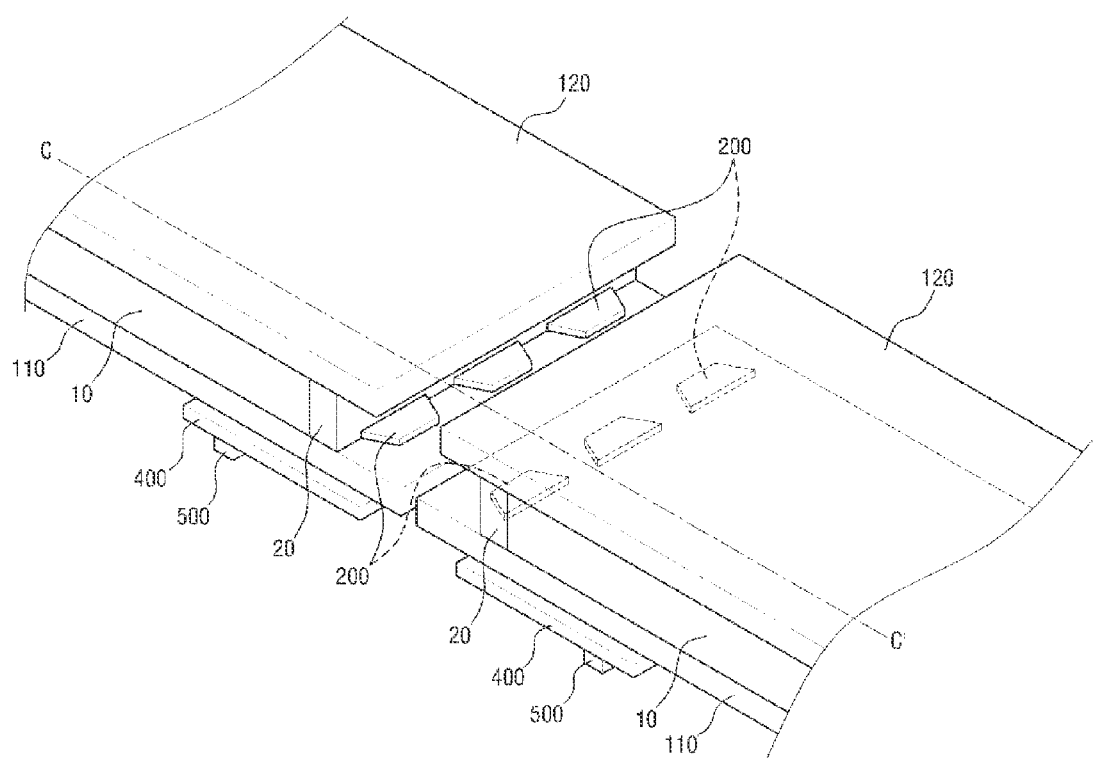
FIG. 7 is a perspective view of a multi-display device according to exemplary embodiments of the invention.
Figure 8:
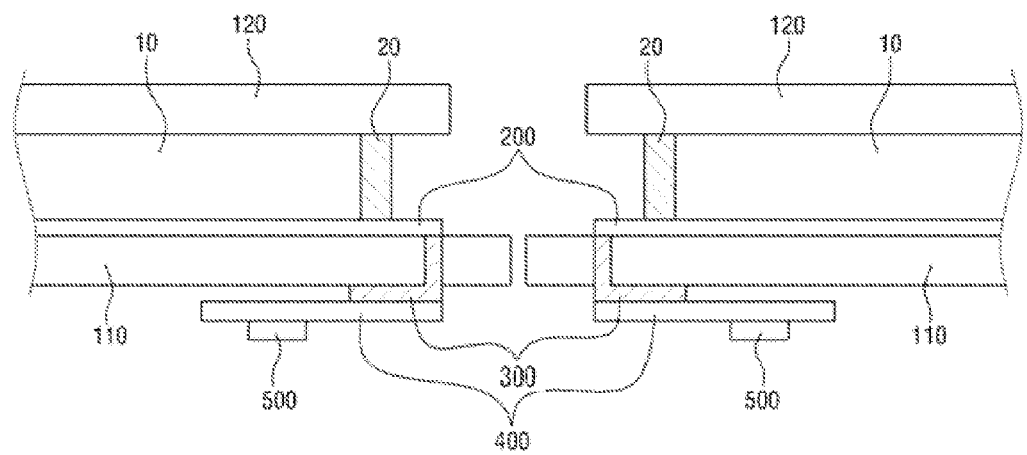
FIG. 8 is a cross-sectional view taken along line C-C' of FIG. 7.
Figure 9:
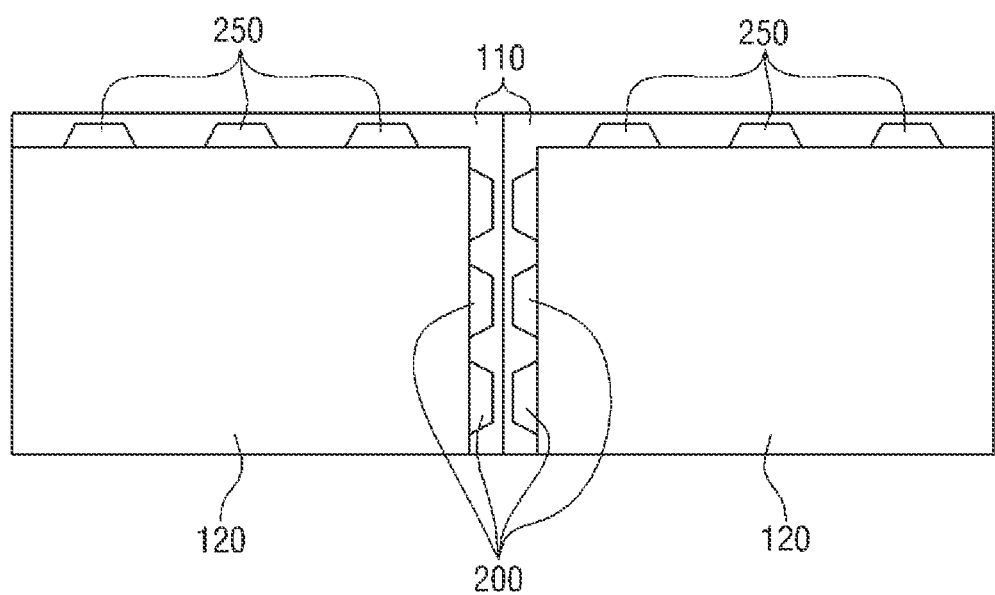
FIG. 9 is a plan view of the multi-display device illustrated in FIG. 7.

FIG. 7 is a perspective view of a multi-display device according to exemplary embodiments of the invention, FIG. 8 is a cross-sectional view taken along line C-C' of FIG. 7, and FIG. 9 is a plan view of the multi-display device illustrated in FIG. 7.

Referring to FIGS. 7 to 9, a multi-display device may include display modules arranged adjacent to one another and a housing (not illustrated), which secures or holds the display modules. Each of the display modules may include an array substrate 110, connectors 200, a PCB 400, and connecting members 300. Similar to above, the connectors 200 may be disposed on the array substrate 110 to transmit signals for driving the array substrate 110. The PCB 400 is electrically connected to the connectors 200 and transmits signals to the connectors 200. And, the connecting members 300 extend through the array substrate 110 and electrically connect the connectors 200 and the PCB 400. The multi-display device may also include a driver IC chip 500, which is disposed on the PCB 400.

The driver IC chip 500 may be disposed on an opposite surface of the PCB 400 opposite to a surface of the PCB 400 that faces the array substrate 110. The array substrate 110 may include a display region and a non-display region surrounding the display region, and the connectors 200 may be provided in the non-display region. The array substrate 110 may also include through holes, which are formed in the non-display region, and the connecting members 300 may be formed or disposed in the through holes. The PCB 400 may be provided on a bottom surface of the array substrate 110. The PCB 400 may be disposed on an area of the bottom surface of the array substrate 110 that corresponds to or is within the display region or may be disposed closer to the center of the array substrate 110 than the through holes.

The display modules of the exemplary embodiment of FIGS. 7 to 9 are substantially similar to their counterparts of the exemplary embodiments of FIGS. 1 to 6, and thus, a detailed description thereof will be omitted.

As shown in FIGS. 7 to 9, the display modules may be arranged side-by-side with each other such that the connectors 200 and the connecting members 300 of one display module may face the connectors 200 and the connecting members 300 of another display module, but aspects of the invention are not limited thereto. That is, the display modules may be arranged in various manners, other than as illustrated in FIGS. 7 to 9.

The housing may secure or hold and accommodate the display modules therein and may form the exterior of the multi-display device. In each of the display modules, an electrical connection may be provided between the top surface of the array substrate 110 and the PCB 400 at the bottom of the array substrate 110 through the through holes of the array substrate 110. Accordingly, an entire electrical connection structure for transmitting electric signals from the driver IC chip 500 may be implemented within the area of the array substrate 110 may be provided.

In a typical multi-display device with multiple display modules, areas are formed near the edges of the display modules, and electrical connection structures for transmitting electric signals from the driver IC chips of the multiple display modules are formed in such areas. Due to the presence of these areas, there are provided non-display regions between display regions of the multiple display modules. However, the non-display regions between the multiple display modules form dead spaces where no images are displayed and, thus, lower the visibility of a display device.

On the contrary, in the multi-display device of FIGS. 7 to 9, an entire electrical connection structure may be provided within the area of the array substrate 110 of each of the display modules. Accordingly, the area of dead space may be effectively reduced, and the visibility of a display device may be improved.

Figure 10:
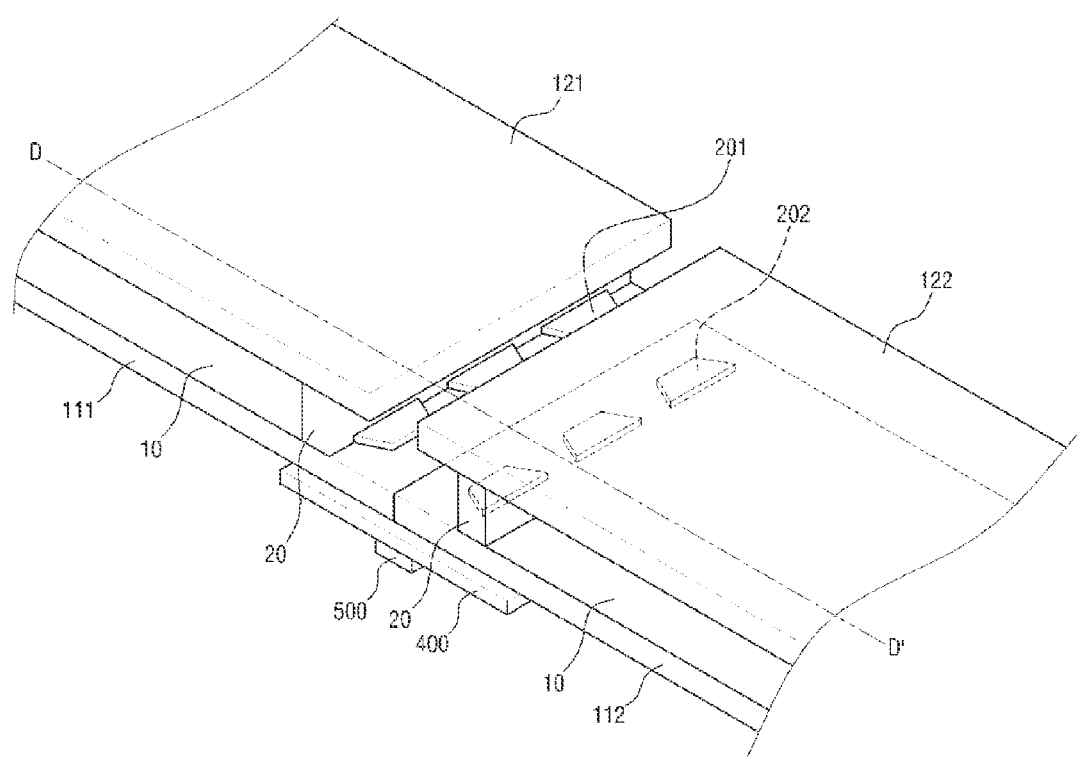
FIG. 10 is a perspective view of a multi-display device according to exemplary embodiments of the invention.
Figure 11:
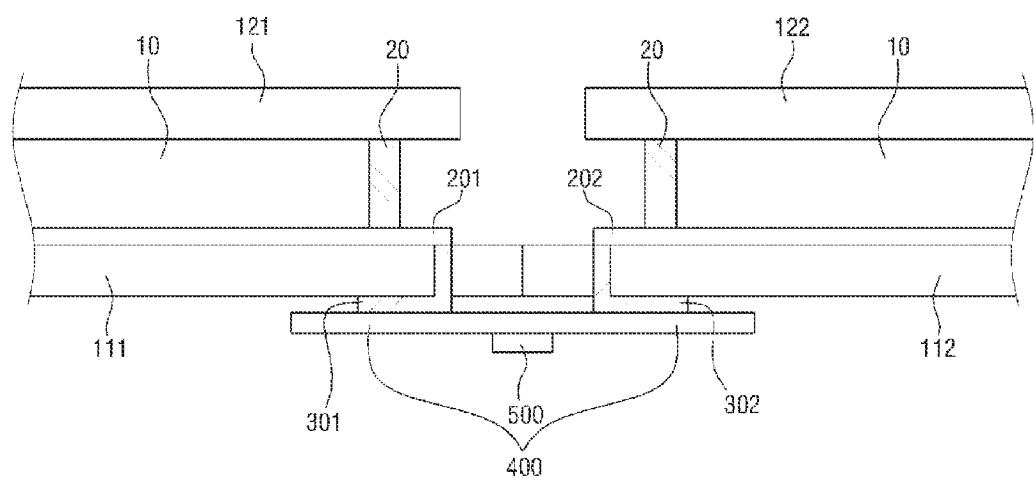
FIG. 11 is a cross-sectional view taken along line D-D' of FIG. 10.

FIG. 10 is a perspective view of a multi-display device according to exemplary embodiments of the invention, and FIG. 11 is a cross-sectional view taken along line D-D' of FIG. 10.

Referring to FIGS. 10 and 11, a multi-display device includes a first array substrate 111 and a second array substrate 112 arranged side-by-side. The multi-display device further includes first connectors 201 disposed on the first array substrate 111 that transmit signals for driving the first array substrate 111 and second connectors 202 disposed on the second array substrate 112 that transmit signals for driving the second array substrate 112. The multi-display includes a PCB 400 electrically connected to the first connectors 201 and the second connectors 202, first connecting members 301, which extend through the first array substrate 111 and electrically connect the first connectors 201 and the PCB 400, and second connecting members 302, which extend through the second array substrate 112 and electrically connect the second connectors 202 and the PCB 400. The display module having the first array substrate 111 also includes a first second substrate 121 and a liquid crystal layer 10 disposed between the first array substrate 111 and the first second substrate 121. The display module having the second array substrate 112 also includes a second second substrate 122 and a liquid crystal layer 10 disposed between the second array substrate 112 and the second second substrate 122.

The display module having the first array substrate 111 and the display module having the second array substrate 112 may be connected to a single PCB, i.e., the PCB 400, so as to form a multi-display device.

The multi-display device may also include a driver IC chip 500, which is provided on the PCB 400. The driver IC chip 500 may realize an image by applying signals to the display region of the first array substrate 111 and the display region of the second array substrate 112 individually or at the same time.

The PCB 400 may be an FPCB. If the PCB 400 is implemented as an FPCB, the multi-display device may be freely bendable along the boundary between the display module having the first array substrate 111 and the display module having the second array substrate 112. Accordingly, a flexible multi-display device may be provided.

Further, the first array substrate 111 and the second array substrate 112 may be formed of a flexible resin, such as a PI resin, thereby making the multi-display device flexible.

In As shown in FIGS. 10 and 11, the first connectors 301 and the second connectors 302 may be on adjacent sides, respectively, of the first array substrate 111 and the second array substrate 112 so that the display module having the first array substrate 111 and the display module having the second array substrate 112 may be electrically connected to each other by a single PCB, i.e., the PCB 400. That is, the PCB 400 may be disposed along or straddle the boundary between the first array substrate 111 and the second array substrate 112. However, aspects need not be limited thereto such that electrical connections or wirings may extend across the bottom surface of one or both of the first array substrate 111 and the second array substrate 112 to connect to a same or different PCBs 400.

Figure 12:
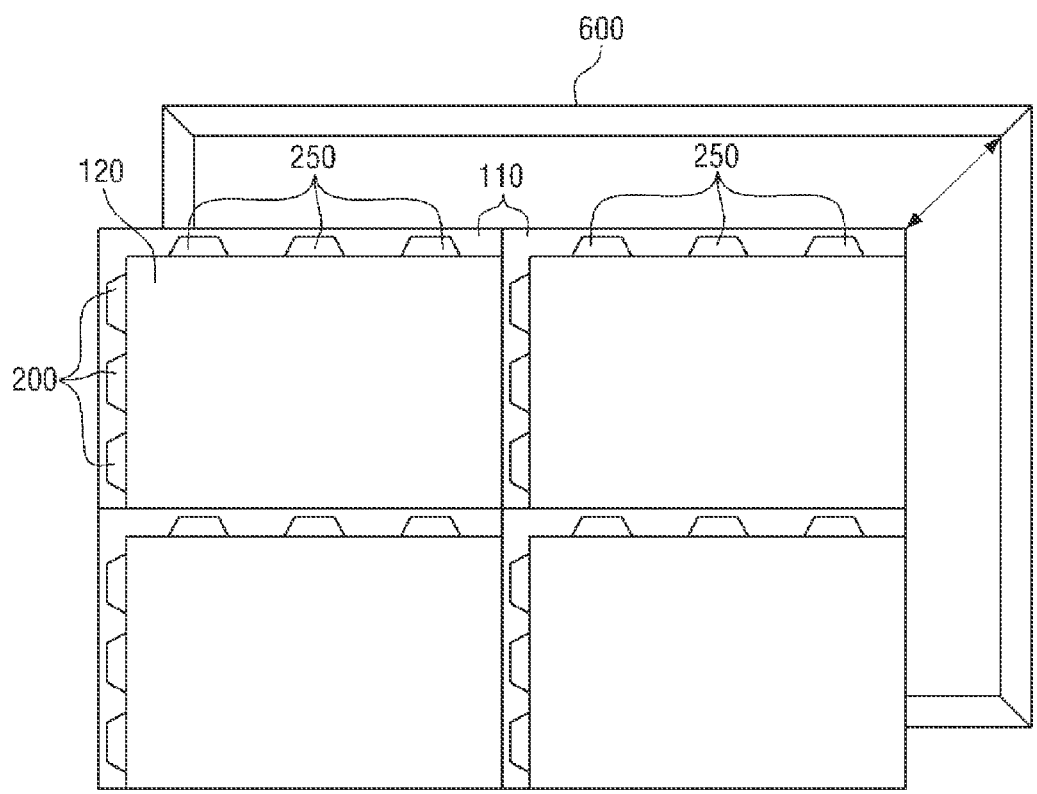
FIG. 12 is a plan view of a multi-display device according to exemplary embodiments of the invention.
Figure 13:
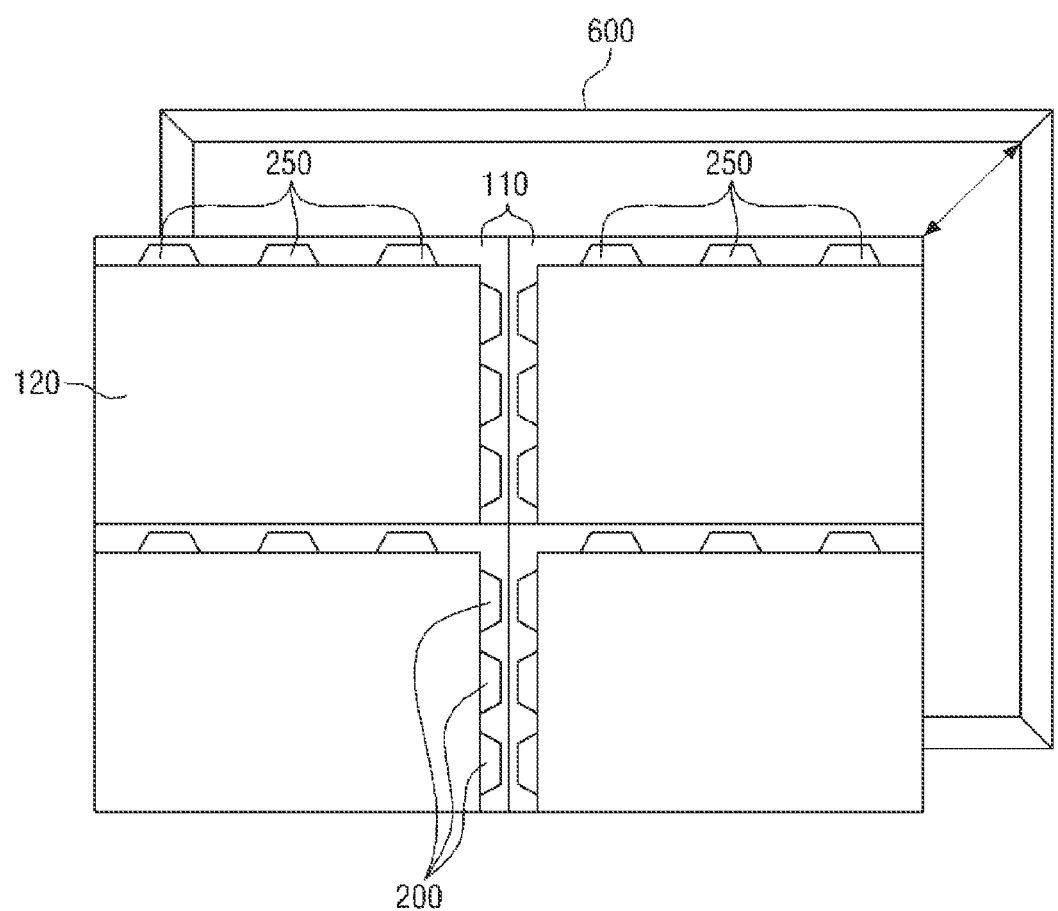
FIG. 13 is a plan view of a multi-display device according to exemplary embodiments of the invention.
Figure 14:
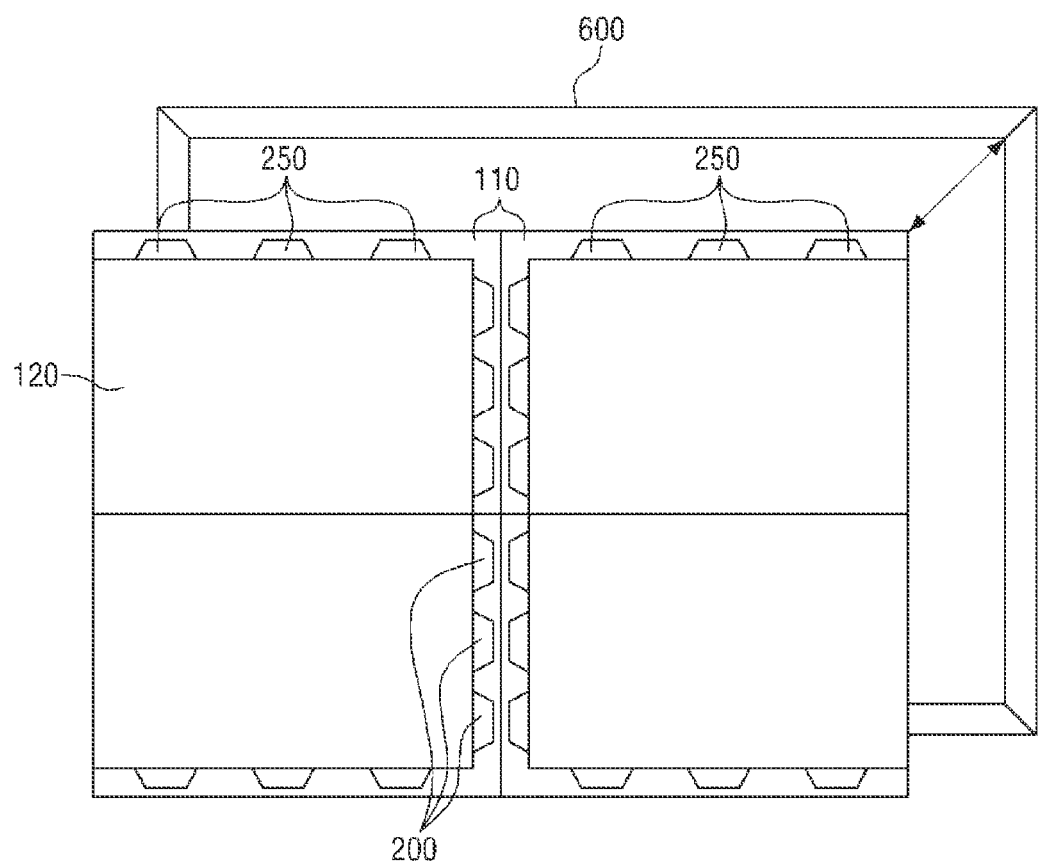
FIG. 14 is a plan view of a multi-display device according to exemplary embodiments of the invention.

FIGS. 12 through 14 are plan views of multi-display devices according to exemplary embodiments of the invention. Various examples of the arrangement of display modules in a multi-display device will hereinafter be described with reference to FIGS. 12 to 14. The display modules may be arranged in a pattern and need not be disposed directly adjacent to each other. For example, four display modules may be arranged in a row pattern or a column pattern in which the four display modules are arranged in straight lines. Further, more or fewer than four display modules may be arranged in patterns. And, edges of the display modules need not align and/or touch such that the pattern need not be a regular shape and spaces may be present between the display modules.

Referring to FIG. 12, display modules may be arranged in a multi-display device in such a manner that they face the same direction. The display modules may be secured by or disposed in a housing 600. For example, each of four display modules may be arranged in such a manner that their connectors 200, which are extensions of data wiring, are disposed in a same direction. Further, each of the four display modules may be arranged such that the connectors 250 of each display module are arranged in a same direction.

Referring to FIG. 13, display modules may be arranged in a multi-display device in such a manner that a pair of vertically adjacent display modules is disposed to have their connectors 200 face the same direction, whereas a pair of horizontally adjacent display modules is disposed such that their connectors 200 face opposite directions. The connectors 250 of the vertically adjacent display modules and the horizontally adjacent display modules may be disposed in same or opposite directions. The horizontally adjacent display modules may be symmetrical with respect to each other.

Referring to FIG. 14, display modules may be arranged in a multi-display device in such a manner that a pair of vertically adjacent display modules and a pair of horizontally adjacent display modules are symmetrical to each other. For example, the connectors 200 of the horizontally adjacent pairs may be disposed in same or opposite directions, and the connectors 200 of the vertically adjacent pairs may be disposed in the same direction. Further, the connectors 250 of the horizontally adjacent pairs may be disposed in the same direction while the connectors 250 of the vertically adjacent pairs may be disposed in same or opposite directions.

Various patterns of arrangement of display modules in a multi-display device have been described above with reference to FIGS. 12 to 14, but aspects of the invention are not limited to the exemplary embodiments of FIGS. 12 to 14. That is, the pattern of the arrangement of display modules in a multi-display device may vary without departing from the scope of the invention.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A multi-display device, comprising:
   a first array substrate;
   a second array substrate disposed adjacent to the first array substrate;
   first connectors disposed on the first array substrate and configured to transmit signals for driving the first array substrate;
   second connectors disposed on the second array substrate and configured to transmit signals for driving the second array substrate;
   a printed circuit board (PCB) configured to electrically connect and transmit signals to the first connectors and the second connectors;
   first connecting members penetrating through the first array substrate and configured to electrically connect the first connectors and the PCB; and
   second connecting members penetrating through the second array substrate and configured to electrically connect the second connectors and the PCB,
   wherein:
   the first and second array substrates each comprises a display region and a non-display region surrounding the display region; and
   the first and second connectors are disposed only in the non-display region of the first and second array substrates, respectively.

2. The multi-display device of claim 1, further comprising:
   a driver IC chip disposed on the PCB.

3. The multi-display device of claim 1, wherein the first connectors and the second connectors are disposed on opposite sides, respectively, of the first array substrate and the second array substrate.

4. The multi-display device of claim 1, wherein the PCB is disposed along a boundary between the first array substrate and the second array substrate.

* * * * *